United States Patent [19]

Lesche

[11] 4,019,146
[45] Apr. 19, 1977

[54] CIRCUIT ARRANGEMENT FOR STORING AN ELECTRICAL ANALOG SIGNAL

[75] Inventor: Wolfgang Lesche, Berlin, Germany

[73] Assignee: Siemens Aktiengesellschaft, Munich, Germany

[22] Filed: Feb. 19, 1976

[21] Appl. No.: 659,522

[30] Foreign Application Priority Data

Feb. 20, 1975 Germany ............................ 2507655

[52] U.S. Cl. ................................ 328/151; 307/353; 307/238; 340/347 SH
[51] Int. Cl.² ...................... H03K 5/00; G11C 27/02
[58] Field of Search ........... 307/235 B, 235 C, 262, 307/238; 328/150, 151, 155; 340/347 SH, 173 R

[56] References Cited

UNITED STATES PATENTS 3,534,273  10/1970  Thomas .......................... 328/151X
3,880,352  4/1975   Ishida et al. ....................... 328/151

Primary Examiner—John Zazworsky
Attorney, Agent, or Firm—Kenyon & Kenyon Reilly Carr & Chapin

[57] ABSTRACT

There is shown two frequency dividers with the same division ratio connected through first and second logic gate members to a clock generator. The phase difference between the outputs of the frequency dividing networks is proportional to the analog signal to be stored. Alternative circuit means are described for connecting the phase difference to a reference signal for comparing with a "new" analog signal. The comparison provides one of two logic conditions, depending on the relative magnitude of the signal represented by the phase difference at the output of the dividing networks and the "new" analog signal to be stored. These logic conditions operate one of respective ones of said first and second logic gate members to alter the flow of pulses into the respective dividing network, whereby the phase difference between the output of the dividing networks is now proportional to the "new" analog signal. During the "store" mode the circuit is provided with additional circuit means for incrementally changing the value of the analog signal.

8 Claims, 6 Drawing Figures

CIRCUIT ARRANGEMENT FOR STORING AN ELECTRICAL ANALOG SIGNAL

BACKGROUND OF THE INVENTION

This invention relates generally to circuits for storing electrical analog signals and particularly to one which includes means for incrementally changing the value of a stored signal.

Under certain circumstances it may be desirable to store an analog signal before it is further processed. E.g. analog signals representative of the conditions at various steps of a manufacturing process are received by data processing equipment for subsequent interpretation and manipulation to determine whether the process is operating within specification or without. These signals cannot, necessarily, be processed at the actual time of their occurrence. Data is received from the various monitoring points to be evaluated well after the instant at which it occurs.

Further, certain analog signals will represent monitored conditions such as the temperature at a particular step in a control process while other analog signals are generated as control signals to alter operating conditions within a process as reflected by the monitored signals. These latter control signals must be changeable, oftentimes by fine, precise increments, to effect necessary changes in particular operating conditions.

It is therefore a primary object of this invention to provide a circuit which can store an analog signal as long as need be prior to further processing.

It is still another object of this invention to provide a circuit which will allow for incremental changes to be made to the stored signal.

SUMMARY OF THE INVENTION

Towards the accomplishment of these and other important objects and advantages which will become apparent from the following description and accompanying drawings, there is described a circuit which comprises two frequency dividing networks having the same division ratio connected in circuit to a frequency generator through first and second logic gates. The phase difference between the pulse outputs of the dividing networks is proportional to the analog signal being processed. Various means are described for comparing the phase difference to the analog signal received so that said phase difference continually reflects the analog signal.

In one embodiment the phase difference is converted to an analog signal which is then compared to the received analog signal. An appropriate logic condition is developed depending on the relative magnitudes, which inhibits one of the logic gates to thereby alter the flow of pulses therethrough. The effect is a change in the phase difference such that the analog signal produced therefrom conforms to the "new" signal.

In an alternate embodiment a reference voltage is integrated for a period of time proportional to the phase difference. The integrated reference voltage is compared to the analog signal and a command signal is generated which together with the pulses at the output of one of the dividing networks is used to temporarily inhibit one or the other of the logic gates. Again the alteration of the flow of pulses changes the phase difference between the outputs of the dividing networks such that it is now proportional to the new signal.

Circuitry is provided for interrupting the "follow-up" mode and for interjecting control pulses which have the effect of altering the pulse flow into a particular one of the dividing networks to effect an incremental change in the analog signal.

The logic gate means can comprise only AND gates, whereby the altering of the pulse trains is caused by blanking a respective one thereof. Or, the logic gate means can comprise a combination of OR and AND gates connected to respective outputs of a two input frequency generator, whereby the altering of the pulse trains is caused by the superpositioning of the two outputs to cause the addition of a pulse at a particular time interval.

DESCRIPTION OF THE PREFERRED EMBODIMENTS

Figure 1:
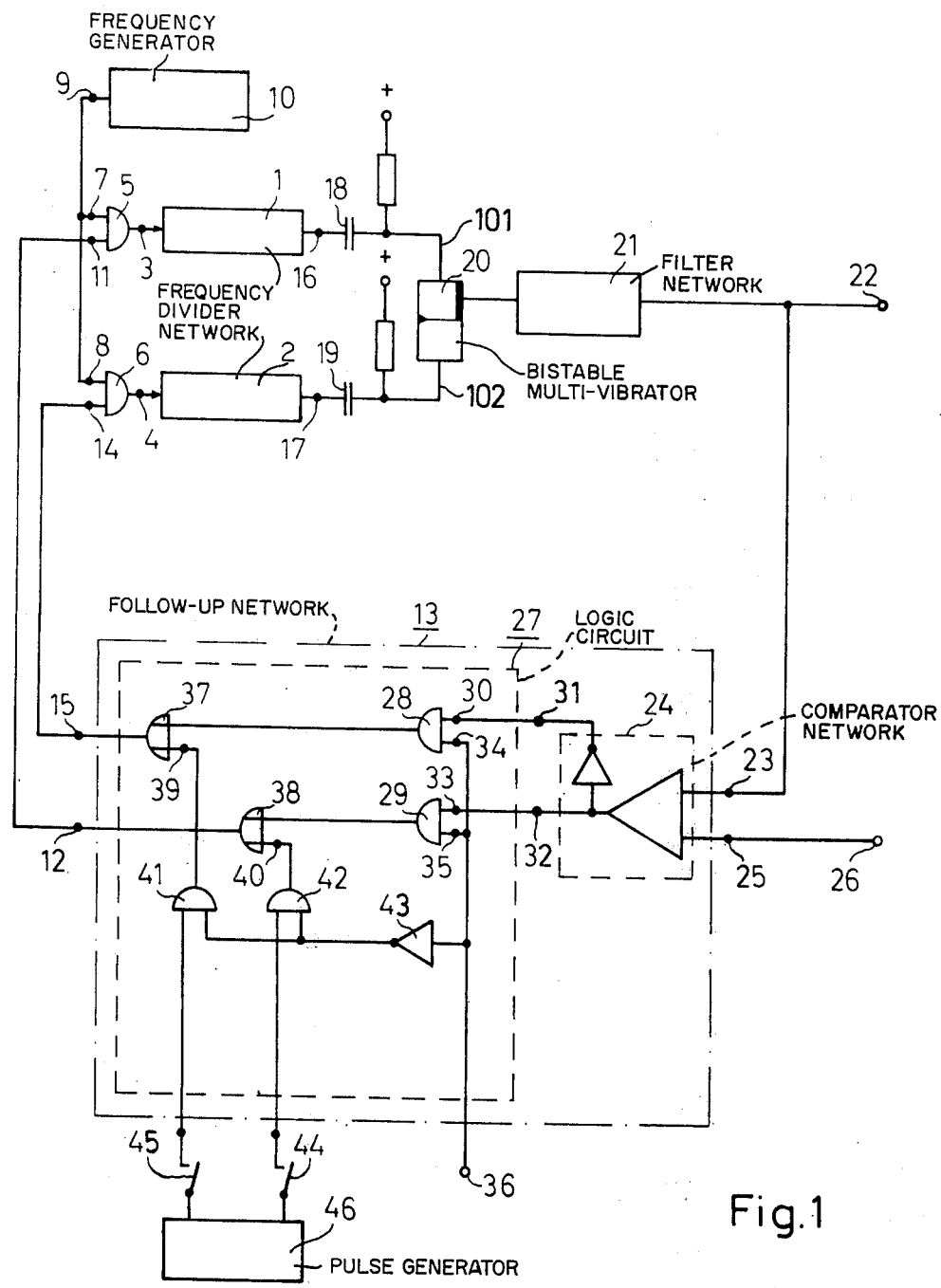
FIG. 1 is a schematic representation of one embodiment of the invention.

Referring now to FIG. 1, this circuit comprises two frequency dividing networks, 1 and 2, which have the identical division ratio. The inputs to the frequency dividing networks, 3 and 4, are connected to respective outputs of a first and second logic gate, 5 and 6. In the embodiments shown, these logic gates would be the standard AND gates, quite well-known to those skilled in the art.

Each of the AND gates have two inputs, 7, 11 and 8, 14. Inputs 7 and 8 are connected together and to the output 9 of a frequency generator 10, sometimes called a "clock" generator. Inputs 11 and 14 are connected to respective outputs, 12 and 15, of what will be called a "follow-up" network, 13, to be described below.

The outputs, 16 and 17, of the frequency dividing networks, 1 and 2, are connected through coupling capacitors, 18 and 19 to the reset and set inputs, 101 and 102, of a bi-stable multi-vibrator, 20. The output of the bi-stable multi-vibrator, is supplied to a filter network 21, of suitable design, so as to produce at the output terminal 22, an analog signal proportional to the wave shape at the output of the multi-vibrator 20, which, in turn, would be proportional to the phase difference between the pulses occurring at the outputs, 16 and 17 of the frequency dividing networks.

The output of the filter 21 is also connected to one of the inputs, 23, of the follow-up network, 13. A second input, 25, to the follow-up network, 13 is connected to the source, via terminal 26, which provides the electrical analog signal to be stored. Input terminals 23 and 25 are connected to respective inputs of a comparator network 24, which provides at its outputs, 31 and 32, logic 1 and logic 0 depending on the relative magnitudes of the analog signals appearing on input terminals 23 and 25.

The outputs, 31 and 32, of the comparator 24 are connected to a logic circuit 27 and, in particular, to respective inputs, 30 and 33, of AND gates 28 and 29. Inputs 34 and 35 of the AND gates 28 and 29 are connected to a control signal innput, 36.

The outputs of the AND gates 28 and 29 are each connected to a respective input of OR gates 37 and 38. The outputs of the OR gates, 37 and 38, are connected through terminals 15 and 12, to the inputs 14 and 11 respectively, of AND gates, 6 and 5.

Additional circuitry is provided which allows for incrementally changing a stored analog signal. This circuit ties in with the previously described circuitry in the logic circuit, 27. It includes a pair of AND gates, 41 and 42 having their outputs connected to the remaining inputs 39 and 40, of the OR gates 37 and 38. One input of each of the AND gates 41 and 42 are connected together and then to the output of an inverter, 43. The input to the inverter 43 is tied to the control signal input 36. The other input of AND gates 41 and 42 are connected through a suitable switching device 44 and 45, to a suitable circuit arrangement 46 which will enable incremental changes to be effected in a stored analog signal. Circuit 46, typically, might be a single pulse generator providing a variable width pulse output which would be applied to the follow-up circuit, either through switch 44 or 45 to effect the number of pulses flowing into the frequency dividing networks, 1 and 2, in a manner described below.

Let us now turn to the operation of the circuit shown in FIG. 1. The circuit operates in two modes as controlled by the logic level on control input 36. For a logic 1 state, the circuit operates in what will be called the "follow-up" mode. When the logic level on the control input is set at a logic 0, the circuit operates in a so-called "storage" mode.

In the follow-up mode, the analog signal developed at the output terminal 22 is driven to be identical to the signal appearing at input terminal 26. Thus there is a continual comparison between the signal at 22 and the one on input 26. Assume for discussion purposes that the signal appearing at the input 23 of the follow-up network 13 is larger than the signal at input 26 and thus 25. This would result in a logic 1 level at output terminal 32 and a logic 0 level at the output terminal 31. In the follow-up mode, as noted earlier, the logic level on control input terminal is a 1. This gates each of the AND gates 28 and 29 and will enable them to pass a logic 1 level whenever it appears on the remaining inputs, 30 or 33. Since the logic 1 level only appears on terminal 33, it being connected to output 32, a logic 1 level will only appear at the output of AND gate 29. This is supplied to one input of the OR gate 38 so that a logic 1 level will also appear at terminal 12 and 11. Since the input to terminal 30 of AND gate 28 is a 0 the input to the OR gate 37 is also a 0. The logic level at input 39, and as well, the input 40 to OR gate 38, is always a logic 0 during the follow-up mode. This is so because the inverter 43 converts the logic 1 level appearing at its input which is in common with the control input, to a logic 0 and, which in turn, is supplied to respective inputs of AND gates 41 and 42, thus disabling those gates and resulting in a logic 0 level at their respective outputs (which in turn are connected to the inputs 39 and 40 of OR gates 37 and 38).

The logic 1 at the input of gate number 5 allows the pulse train generated by the clock 10 to pass therethrough and be counted down by the frequency divider 1. The logic 0 appearing at input 14 of AND gate 6 inhibits that gate and precludes the transmission thereby of, for instance, a single pulse in the pulse train generated by the clock. This effect is shown in diagram $a$ of FIG. 2.

Figure 2:
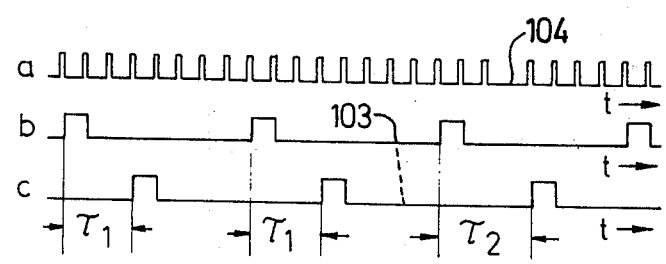
FIG. 2 are wave form diagrams used to explain the operation of the circuit FIG. 1.

Consider FIG. 2. Diagrams $b$ and $c$ would represent the respective outputs of dividing networks 1 and 2, for a particular analog signal at input 26. At some point in time 103, the signal at input 26 would be changed to provide the condition set forth above. The logic 0 at input 14 of gate 6, as explained above, would inhibit one of the pulses flowing into the dividing network 2. This blanking of a pulse is shown at point 104 in diagram $a$. Because of this missing pulse, the output of dividing network 2 is shifted from its previous $\tau_1$ relationship to the output of network 1, to $\tau_2$.

In response to the altered phase difference between the outputs of dividing networks 1 and 2, the "on-off" times of the multi-vibrator output are also varied with the result being that the output of filter 21 is correspondingly changed in a manner that the signal now appearing at that point is made identical to the signal at input 26.

If, initially, the relationship of the signals at terminals 23 and 25 were opposite than that described above, the result would have been a blanking of one or more pulses of the frequency train passing through AND gate 5 with the eventual effect, again, of bringing the analog voltage at terminal 22 to the value of the voltage on terminal 26.

The alternate mode, the store mode, is initiated with the application of a logic 0 state at control input 36. This level inhibits AND gates 28 and 29 thus precluding transmission of any logic information through that chain. The logic 0 at the input 34 and 35 of AND gates 28 and 29 result in logic 0's at the corresponding inputs to OR gates 37 and 38. Further, with a logic 0 appearing on control input 36, the inverter 43 then presents a logic 1 to the inputs of AND gates 41 and 43 in common with the inverter's output. Thus, these AND gates are enabled so that they may pass a logic 1 whenever it appears on either one of their respective remaining inputs. When there is no desire to incrementally change the stored signal, switches 44 and 45 are open so that, in fact, the logic levels on the corresponding inputs of AND gates 41 and 42 are at a logic 1 level. Therefore, the outputs of these AND gates are also at a logic 1 level which is then passed through the OR gates 37 and 38 to the inputs of AND gates 5 and 6. This maintains these gates, 5 and 6, in a continuously enabling mode so that all of the pulses generated by clock 10 pass therethrough into dividing networks 1 and 2. As a result the phase difference between the outputs of the dividing networks remains constant. Consequently, the signal at output 22 remains constant and equal to the analog signal present at input 26 at the time the signal to store is received.

Thereafter, if it is desired to incrementally change the stored signal, either switch 44 or 45 would be closed—depending on whether it is to be changed upward or downward. Switches 44 and 45 are preferably within the generator 46 and are activated electrically or mechanically.

As explained above, 46, for example, would represent a single pulse generator with negatively going pulses, i.e. from logic 1 to logic 0. When activated to increment the stored analog signal, switch 45, for example, would be closed and a negatively going pulse introduced. The logic 0 would be passed through AND gate 41 and appear on input 39 or OR gate 37. Because the circuit is in the "store" mode, as explained above the other input to the OR gate 37, is also a logic 0. The result is a logic 0 at the input to AND gate 6 and the blocking of pulses therethrough. As explained above, this alters the phase difference between the outputs of the dividing networks, the "on-off" times of the multi-vibrator 20 and eventually the magnitude of the analog signal at the output of filter 21.

For the opposite effect, switch 44 would be closed and 45 opened. The negative going pulse, logic 0, would appear at the input 40 of OR circuit 38. Again because of the "store" mode, this logic 0 would pass through the OR gate and on to input 11 of AND gate 5. With this gate inhibited, the pulse train would be altered such that the eventual signal at the output of filter 21 would be incrementally changed in the opposite direction. Applying additional pulses through either switch 44 or 45 would step the output 22 to any desired level. When it was again desired to have the output 22 "follow" the signal at 26, a logic 1 is applied to control input 36, with the circuit responding as described above.

Figure 3:
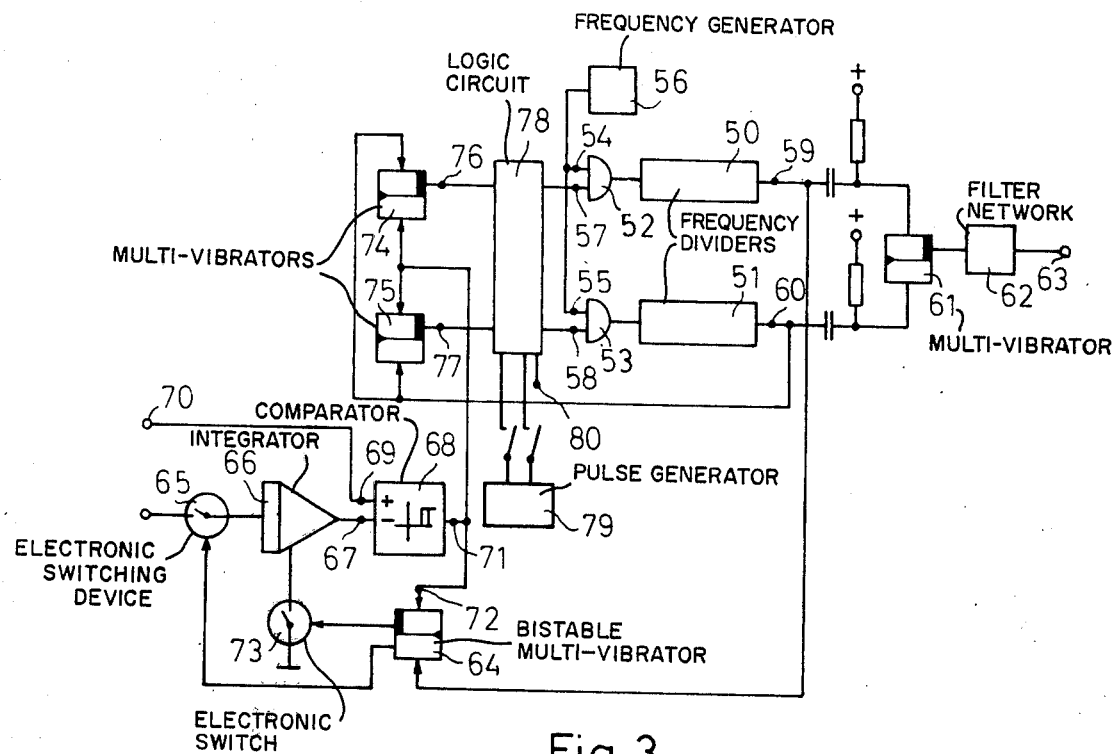
FIG. 3 is a schematic diagram of an alternate embodiment of the invention.

The circuit arrangement according to FIG. 3 also contains two frequency dividers 50 and 51 with the same division ratio. They are again preceded by AND gates 52 and 53. Respective inputs 54 and 55, of the AND gates 52 and 53 are connected to the output of clock 56. The other inputs 57 and 58 are connected, as already explained in detail in connection with FIG. 1, with a logic circuit 78, the design of which corresponds to logic circuit 27, in FIG. 1. The logic circuit 78 is again connected to a suitable circuit arrangement, 79, for incrementally changing the stored signal.

The outputs 59 and 60 of the frequency dividers 50 and 51 are connected to a multi-vibrator 61 followed by a filter 62, exactly as already explained in FIG. 1. Accordingly, an analog signal again appears at the output 63, which corresponds to the analog signal to be stored.

The output 59 of the frequency divider 50 is, in addition, connected to the set input of a bistable multi-vibrator 64. One output of the latter controls an electronic switching device 65, which, when activated, connects a reference voltage source, not shown, to an integrator, 66. Input 67 of comparator 68 is connected to the output of the integrator 66. The other comparator input 69 is connected via input terminal 70 to the electrical signal to be stored.

The output 71 of the comparator 68 is connected to the reset input 72 of the bistable multi-vibrator 64. The "multi's" second output serves to control a further electronic switch 73 which is used to reset the integrator 66. The comparator output 71 is also connected to the reset and set inputs respectively of two additional bistable multi-vibrators 74 and 75, whose other inputs are in common with the output 60 of the frequency divider 51. Corresponding outputs of bistable multi-vibrators 74 and 75 are connected to the logic circuit inputs 76 and 77.

Figure 4:
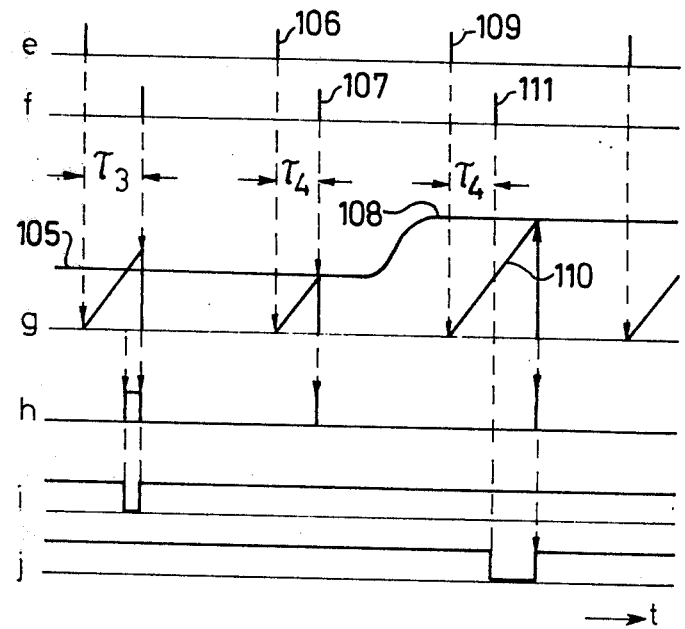
FIG. 4 are wave form diagrams useful in the explanation of the operation of the circuit of FIG. 3.

To understand the operation of the circuit arrangement of FIG. 3, consider the wave diagrams of FIG. 4. In FIG. 4, $e$ and $f$, the outputs of the frequency divider 50 (diagram $e$) and the frequency divider 51 (diagram $f$) are shown. Assume that the output pulses of the two frequency dividers 50 and 51 initially had a phase shift $\tau_3$. When the first output pulse of the frequency divider 50 appears, the bistable multi is set, closing switch 65 and opening switch 73. The integrator 66 operates on the reference voltage to produce the ramp voltage output shown in FIG. 4g.

The analog input signal appears at input 70 and is shown in FIG. 4g as 105. When the integrator output reaches the value of the analog signal at the input 70, comparator 68 generates an output signal which is shown in FIG. 4h. This signal resets multi 64 which activates switch 73 to reset the integrator. Further the signal controls the multi-vibrators 74 and 75 such that the logic levels at 76 and 77 are opposite. Such AND gate 52 is inhibited while gate 53 is enabled. When the first pulse appears at the output 60 of the frequency divider 51, this resets multi-vibrator 74, again enabling gate 52. Waveform 4($i$) shows the logic level at input 57 of gate 52. During the brief period that gate 52 is inhibited, for example, one pulse of clock 56 might be blanked so that the phase shift between the next-following output pulses of the frequency dividers 50 and 51 has been reduced to $\tau_4$. With this phase shift, the second output pulse 106 of the frequency divider 50 in conjunction with the second output pulse 107 of the frequency divider 51 prevents a comparator output signal, so that both AND members 52 and 53 remain enabled. The phase of the output signals of the two frequency dividers 50 and 51 is not changed and the signal at the output 63 of the circuit arrangement is maintained constant and equal to the analog signal at the input 70.

Consider a signal change at input 70 such as the one shown in the second part of FIG. 4g. After the signal reaches 108, pulse 109 triggers multi 64 which connects in the reference voltage to the integrator 66. Before the integrator output 110 reaches level 108, pulse 111 occurs at the output of divider 51. This resets multi 75. The output of multi 75 and the input 58 to AND gate 53 is shown in FIG. 4j. This is processed by logic circuit 78 such that AND gate 53 is inhibited preventing passage of pulses therethrough. This state continues until the integrator voltage 109 reaches the input level 108. At this point the comparator output FIG. 4h, changes to a logic 1. This sets multi 75 and thus ends the inhibiting of AND gate 53. Thereafter the relative phase between the outputs of circuits 50 and 51 are changed accordingly so that the output of the filter 62 changes to the magnitude of the input signal 70.

As already discussed in detail in connection with FIG. 1, one can change from the "follow-up" state to the "store" mode by applying the proper logic level at the control input 80 of the logic circuit 78. Also, the stored value can be changed incrementally during the store mode, if necessary, by means of the circuit 79.

Figure 5:
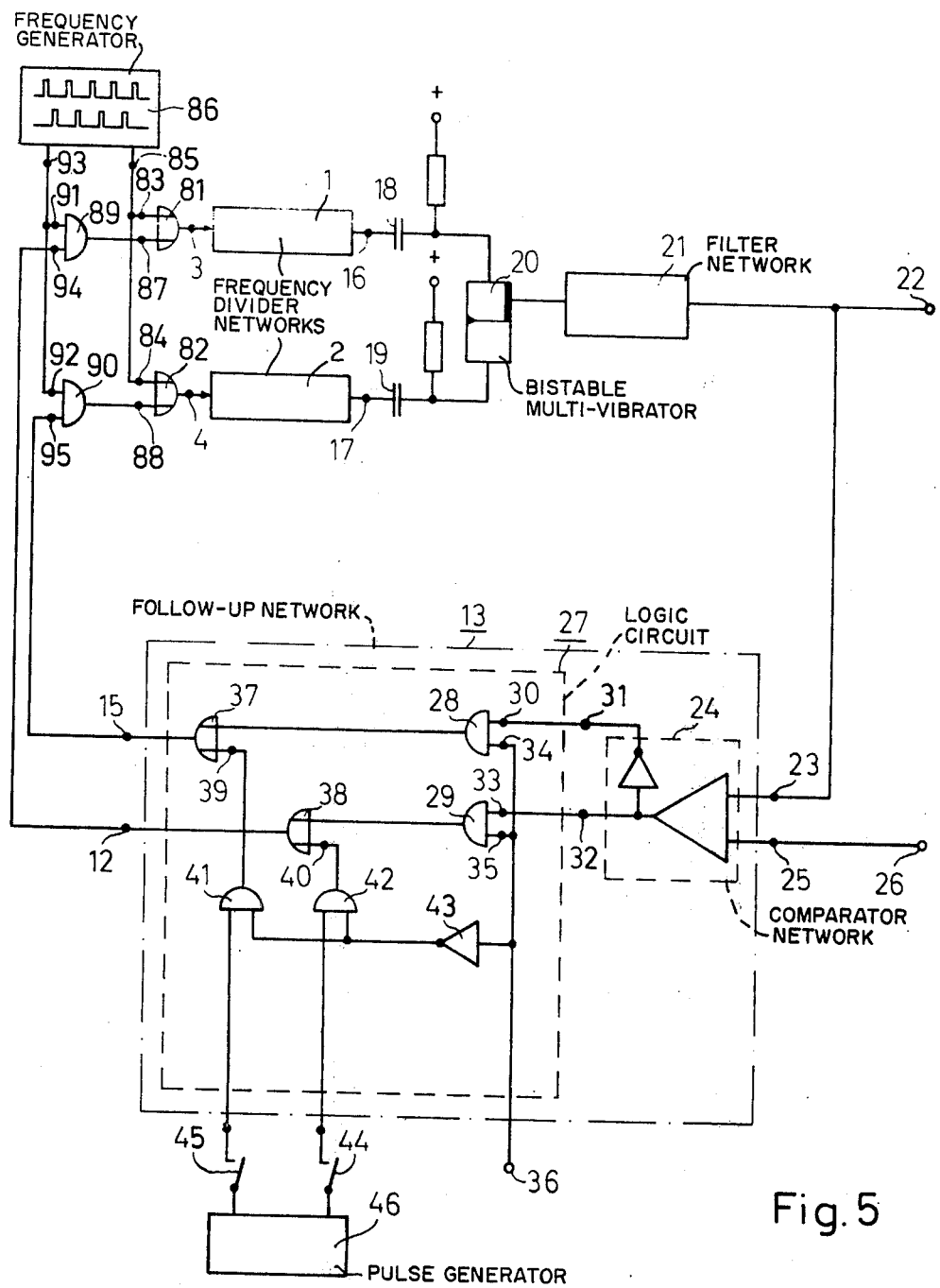
FIG. 5 is a schematic diagram of yet another embodiment of the invention.

The embodiment shown in FIG. 5 differs from that shown in FIG. 1 in that OR gates 81 and 82 are used as logic members instead of the AND gates 5 and 6.

Clock 86 in this embodiment includes two output terminals 85 and 93 respectively. These have the same repetition rate but are timed with respect to one another such that the pulses at the output 93 occur during the off time of output 83 and vice versa. The effect, when the two signals are superimposed is one having twice the repetition rate. Inputs 83 and 84 of OR gates 81 and 82 are connected together and to one of the clock outputs 85. Inputs 87 and 88 of OR gates 81 and 82 are connected to the outputs of AND gates 89 and 90. Respective inputs of these AND gates are commoned and connected to the other clock output, 93. The remaining inputs, 94 and 95 are connected to logic circuit 13, which is identical in design as the one described in FIG. 1. Also the remainder of the circuit FIG. 5 is identical to the one shown in FIG. 1.

In this circuit arrangement, assuming an initial discrepancy between the magnitude of the analog signals at the output 22 and the input 26, a logic 1 would appear at either input 94 of 95, enabling the respective AND gate. Assume a logic 1 on input 94. Pulses appearing on output 93 of the clock pass through AND gate 89 and appear at input 87 of OR gate 81. The output on line 3 appears as the superposition of the pulse outputs on 85 and 93. Processing of this synthesized pulse train by network 1 results in a change in the phase difference between the outputs of 1 and 2, such that the output signal at terminal 22 is made to conform in magnitude to the signal on line 26.

Where a logic 1 appears on line 95, AND gate 90 is enabled and the output, 4, of OR gate 82 becomes the superposition of the two wave forms.

Figure 6:
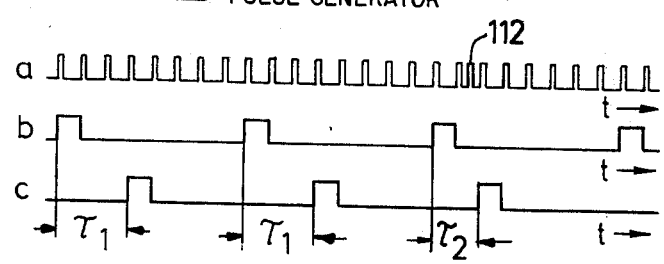
FIG. 6 are wave form diagrams useful in the explanation of the circuit of FIG. 5.

FIG. 6a shows either the output 3 or 4 of their respective OR gates with the added pulse at 112 and b and c depict the effect at the output of networks 1 and 2.

Other variations in the construction of the circuits disclosed can be made without departing from the spirit of the invention as described in the appended claims.

What is claimed is:

1. A circuit arrangement for storing electrical analog signals comprising:
    a. a frequency generator having at least one output;
    b. first and second logic gate means connected in circuit to said generator;
    c. first and second frequency dividing networks connected to respective outputs of said first and second logic means;
    d. means for comparing the phase difference between the output signals of each of said dividing networks with the magnitude of the analog signal to be stored, said comparison means having two logic outputs connected to respective second inputs of said first and second logic gate means,
    whereby the logic levels appearing on each of the outputs of said comparison means is a function of the comparison between said phase difference and the analog signal to be stored, said logic levels altering the number of pulses from said frequency generator flowing through each of said first and second logic gate means and into said frequency dividing networks such that said phase difference is made proportional to the analog signal to be stored; and
    e. means responsive to a signal to store said analog signal connected in circuit with said means for comparing, such that in response to said signal to store, the operation of said means for comparing is interrupted,
    whereby said logic levels thereafter permit pulses to continuously flow through each of said first and second logic gate means such that said phase difference remains constant during the period said signal to store is present.

2. The circuit of claim 1 wherein said means for comparing comprises:
    a. means for converting the phase difference between the output signals of each of said dividing networks into a first analog signal; and
    b. means for comparing the magnitude of said first analog signal with the magnitude of the analog signal to be stored,
    whereby the logic levels appearing on each of the outputs of said comparison means is a function of the comparison between said first analog signal and the analog signal to be stored.

3. The circuit of claim 2 further comprising logic circuit means responsive to the comparison of magnitudes of said analog signals to produce a first logic condition on the outputs of said comparison means when the magnitude of said first analog signal is greater than the magnitude of the analog signal to be stored and a second logic condition on the outputs of said comparison means when the magnitude of said first analog signal is less than the magnitude of the analog signal to be stored, said first logic condition altering the number of pulses from said frequency generator flowing through said first logic means into said first frequency dividing network, said second logic condition altering the number of pulses from said frequency generator flowing through said second logic means into said second frequency dividing network.

4. The circuit of claim 1 wherein said means for comparing comprises:
    a. a reference voltage source;
    b. means for integrating the output of said reference voltage source in response to a first command signal;
    c. means connected in circuit between the output of said first dividing network and said integrating means for generating said first command signal in response to a pulse at the output of said first dividing network;
    d. means connected in circuit to the output of said means for integrating and to the signal to be stored for generating a second command signal when said output of said integrating means exceeds in magnitude the signal to be stored; and
    e. means connected in circuit to the output of said last mentioned means and to the output of said second dividing network for producing a first and second logic condition in response to said second command signal and to a pulse at the output of said second dividing network,
    said first logic condition occurring when said second command signal precedes the occurrence of a pulse on the output of said second dividing network, said second logic condition occurring when said second command signal follows the occurrence of a pulse on the output of said second dividing network
    whereby said first logic condition alters the number of pulses from said frequency generator flowing through said logic means into one of said frequency dividing networks, said second logic condition altering the number of pulses from said frequency generator flowing through said logic means into the other of said frequency dividing networks.

5. The circuit of claim 4 further comprising reset circuit means connected in circuit between the circuit means generating said second command signal and said integrating means, whereby said integrating means is reset upon the occurrence of said second command signal.

6. The circuit of claim 1 wherein each of said first and second logic means are AND gates and wherein said logic levels alter the number of pulses flowing into respective ones of said dividing networks by inhibiting one or the other of said AND gates, whereby pulses otherwise flowing through the AND gate that is inhibited are blanked out.

7. The circuit of claim 1 wherein said frequency generator has two clock outputs, each of said clock outputs having the same repetition rates, one of said clock outputs having a time relationship with the other clock output such that the repetition rate of a wave comprising the superposition of the two clock outputs is twice the repetition rate of each clock output and wherein each of said first and second logic means comprises:
   a. an AND gate connected in circuit to one of said clock outputs;
   b. an OR gate connected in circuit to the other of said clock outputs and to the output of its respective AND gate, the output of said OR gates connected to respective ones of said dividing networks,
   whereby said logic levels alter the number of pulses flowing into one or the other of respective ones of said dividing networks by superpositioning the pulses appearing at one clock output with the pulses appearing at the other clock output at the output of said respective OR gate.

8. The circuit of claim 1 wherein said phase difference is proportional to a first analog signal and wherein said means for comparing comprises:

a. a first circuit for generating a first logic condition when the magnitude of the analog signal to be stored is greater than said first analog signal and a second logic condition when the magnitude of the analog signal to be stored is less than said first analog signal;
   b. first logic circuit means including,
      i. a first AND gate, and
      ii. a second AND gate,
   said first and second AND gates having a respective first input connected in circuit to said first circuit means to detect said first and second logic condition when enabled by a first control signal,
      iii. a first OR gate,
      iv. a second OR gate,
   one input of said first and second OR gates connected to respective outputs of said first and second AND gates, said first and second OR gates having said two logic outputs; and
   c. second logic circuit means, connected in circuit with a second input of each of said OR gates; and
   d. means responsive to a second control signal and connected in circuit to said second logic circuit means for incrementally changing the value of any analog signal stored by altering a designated one of said logic levels at said logic outputs.

* * * * *